(12) United States Patent
Liu et al.

(10) Patent No.: US 7,494,830 B2
(45) Date of Patent: Feb. 24, 2009

(54) METHOD AND DEVICE FOR WAFER BACKSIDE ALIGNMENT OVERLAY ACCURACY

(75) Inventors: Sheng-Chieh Liu, Taichung (TW); Tzu-Yang Wu, Hsinchu (TW); Ya-Wen Lee, Taichung (TW); Jeffery Chu, Taipei (TW); Hsueh-Liang Chou, Jhubei (TW); Chia-Hung Kao, Budai Town (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 66 days.

(21) Appl. No.: 11/697,543

(22) Filed: Apr. 6, 2007

(65) Prior Publication Data

US 2008/0248600 A1  Oct. 9, 2008

(51) Int. Cl.
*H01L 23/544* (2006.01)
(52) U.S. Cl. .............. 438/16; 438/17; 438/18; 438/401; 438/462; 257/797; 257/E23.179
(58) Field of Classification Search ............ 438/16–18, 438/401, 462; 257/797, E23.179
See application file for complete search history.

(56) References Cited

U.S. PATENT DOCUMENTS

| | | | |
|---|---|---|---|
| 5,757,507 A * | 5/1998 | Ausschnitt et al. ......... 356/401 |
| 5,834,334 A * | 11/1998 | Leedy ......................... 438/107 |
| 5,929,997 A | 7/1999 | Lin | |
| 6,380,554 B1 | 4/2002 | Bush et al. | |
| 6,383,827 B1 | 5/2002 | Lukanc et al. | |
| 6,393,714 B1 * | 5/2002 | Look et al. .................... 33/645 |
| 6,423,555 B1 | 7/2002 | Babcock | |
| 6,525,805 B2 | 2/2003 | Heinle | |
| 6,716,559 B2 | 4/2004 | Leidy et al. | |
| 6,844,244 B2 * | 1/2005 | Best et al. ..................... 438/460 |
| 6,921,916 B2 * | 7/2005 | Adel et al. .................... 257/48 |
| 6,952,886 B1 | 10/2005 | Kim | |
| 6,967,709 B2 | 11/2005 | Mellinger et al. | |
| 7,084,427 B2 | 8/2006 | Argandona et al. | |
| 7,099,011 B2 * | 8/2006 | McArthur et al. ........... 356/401 |
| 2002/0102482 A1 * | 8/2002 | Smith et al. .................... 430/22 |
| 2002/0140917 A1 * | 10/2002 | McArthur et al. ............. 355/53 |
| 2002/0167649 A1 * | 11/2002 | Heinle ......................... 355/53 |
| 2004/0051127 A1 * | 3/2004 | Tanaka ......................... 257/296 |
| 2006/0249859 A1 * | 11/2006 | Eiles et al. .................. 257/797 |

(Continued)

OTHER PUBLICATIONS

Hasan, T., et al, "Automated Electrical Measurements of Registration Errors in Step-and-Repeat Optical Lithography Systems", IEEE Transactions on Electron Devices, vol. ED-27, No. 12, Dec. 1980, pp. 2304-2312.*

(Continued)

*Primary Examiner*—George Fourson
(74) *Attorney, Agent, or Firm*—Haynes and Boone, LLP

(57) ABSTRACT

A method for wafer backside alignment overlay accuracy includes forming a buried layer on a front-side of a wafer; forming a conductive layer on the buried layer and patterning a first test structure and a second test structure therein; forming an etch stop layer on the conductive layer; etching through the wafer from the backside to perform an alignment process with the first test structure; and determining an overlay accuracy of the alignment process with the second test structure. The first test structure includes an optical vernier and the second test structure includes an electrical testing structure.

14 Claims, 7 Drawing Sheets

U.S. PATENT DOCUMENTS

2007/0072091 A1* 3/2007 Smith et al. .................... 430/5
2007/0216041 A1* 9/2007 Patti et al. .................... 257/797
2007/0249137 A1* 10/2007 Liu et al. .................... 438/401

OTHER PUBLICATIONS

H. W. Van Zeijl et al., "Characterization of front- to backwafer bulk micromachining using electrical overlay test structures," Delft Institute of Microelectronics and Submicron Technologies, Feldmannweg 17, 2628 CT Delft, The Netherlands, pp. S109-S112.

H. W. Van Zeijl et al., "Backwafer Optical Lithography and Wafer Distortion in Substrate Transfer Technologies," Proceedings of SPIE, vol. 4181, Aug. 2000, pp. 200-207, The Netherlands.

H. W. Van Zeijl et al., "Front- to Backwafer Alignment, Overlay and Wafer Distortion in Substrate Transfer Technologies," Proceedings of the SAFE/IEEE Workshop, Nov. 29-30, 2000, pp. 163-167, The Netherlands.

H. W. Van Zeijl et al., "Characterization of Front- to Backwafer Bulk Micromachining Using Electrical Overlay Test Structures," 1 page (abstract).

* cited by examiner

METHOD AND DEVICE FOR WAFER BACKSIDE ALIGNMENT OVERLAY ACCURACY

CROSS-REFERENCE

The present disclosure is related to the commonly-assigned U.S. patent application Ser. No. 11/409,582, filed Apr. 24, 2006, entitled "METHOD AND SYSTEM FOR WAFER BACKSIDE ALIGNMENT," the entire disclosure of which is hereby incorporated herein by reference.

BACKGROUND

The present disclosure relates generally to fabrication of micro-electro mechanical systems (MEMS) devices, and more particularly, to wafer backside alignment in fabrication of MEMS devices. The present disclosure also relates to an improved method and device for determining an overlay accuracy of wafer backside alignment in fabrication of MEMS devices.

MEMS devices are common in applications, including wafer leveling packaging, integrated optics, pressure sensors, compound devices, and backside vias. In fabrication of three-dimensional devices such as MEMS, the substrate is processed on one side, flipped over, and is processed on the opposite side to create a desired three-dimensional structure. Front-side and backside alignment are performed to ensure that the three-dimensional structure is properly aligned. For example, if a contact runs through the substrate from the front-side to the backside, it must be precisely aligned to other elements of the device, such that electrical contacts can be made.

Therefore, what is needed is a simple and cost effective method and device for determining an overlay accuracy of a wafer backside alignment process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
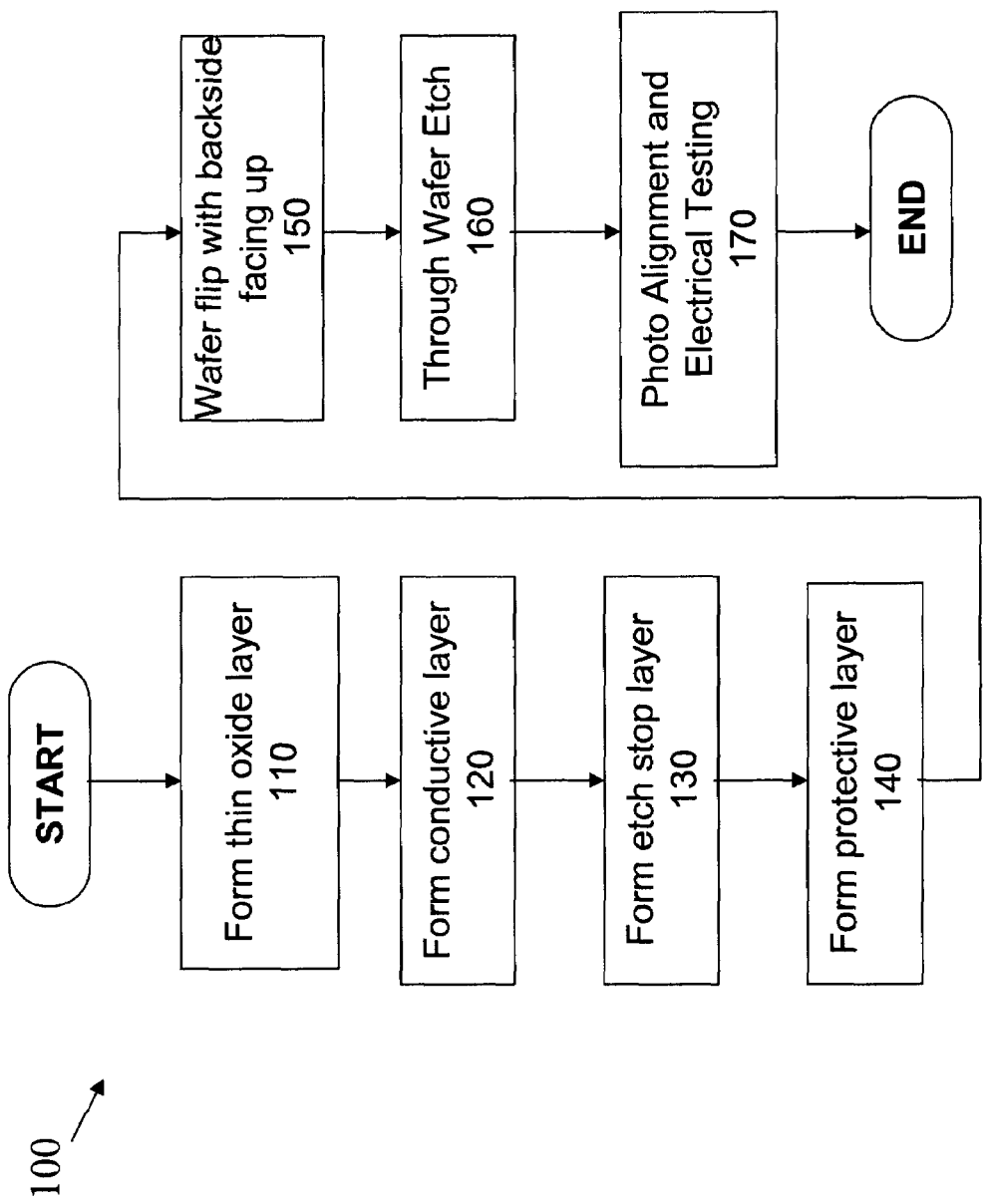
FIG. 1 is a flowchart of a method for determining an overlay accuracy of a wafer backside alignment process according to one or more embodiments of the present disclosure.

For the purposes of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, and this does not by itself indicate a requirement that features of one embodiment apply to another embodiment, even if they share the same reference number.

Aspects of the present disclosure provide a method and a system for determining an overlay accuracy of a wafer backside alignment process. In an illustrative embodiment, a two part process may be performed including a wafer front-side deposition process and a backside through wafer etch process. Referring to FIG. 1, illustrated is a flowchart of an exemplary method 100 for determining the overlay accuracy of a backside alignment process. The method 100 begins with step 110 in which a thin oxide layer may be deposited on a front-side of a wafer. The wafer may include a semiconductor substrate, such as a silicon substrate. It is understood that other types of semiconductor substrates may also be used. The thin oxide layer may be referred to as a buried layer. The thin oxide layer may include a thermal oxide or oxidation film formed by physical vapor deposition (PVD) or other suitable process. The thin oxide film may have a preferred thickness of about 125 A.

The method 100 continues with step 120 in which a conductive layer may be deposited on the thin oxide layer. The conductive layer may include a doped polysilicon (POLY) or other suitable conductor material. The conductive layer may be formed by chemical vapor deposition (CVD) or other suitable process. The conductive layer may have a preferred thickness of about 3000 A. The conductive layer may be patterned with test structures, such as an optical vernier and an electrical testing structure. For example, the optical vernier and electrical testing structure may be formed by etching the conductive layer. The optical vernier and electrical testing structure may be used to qualify and/or measure a backside alignment overlay accuracy in subsequent processing of the backside of the wafer. The configuration of the optical vernier and electrical testing structure will be discussed in more detail later.

The method 100 continues with step 130 in which an etch stop layer may be deposited on the conductive layer. The etch stop layer may include a thick oxide formed by physical vapor deposition (PVD) or other suitable process. The etch stop layer may include a thermal oxide or oxidation film. The etch stop layer may be used as a stop layer in a subsequent through wafer etch process that will be discussed later. It is understood that the thin oxide layer (step 110), conductive layer (step 120), and etch stop layer (step 130), discussed above, may be formed with current processing techniques and materials such that no additional and/or special processing steps are required to form these layers when fabricating a variety of semiconductor devices.

Additionally, in step 140, a protective layer may optionally be deposited on the etch stop layer. The protective layer may include an oxidation film or a passivation film formed by PVD or other suitable process. The protective layer may have a preferred thickness of about 30,000 A. The protective layer may be configured to protect the front-side of the wafer during subsequent processing of the backside of the wafer. For example, the protective layer may protect the front-side from scratches during wafer transfer and/or vacuum bake, since the front-side is faced down when the wafer is flipped over for processing. Furthermore, the protective layer may strengthen the alignments marks and the front-side structures in case the photoresist is not thick enough. Steps 110 through 140 make up the wafer front-side deposition process.

The method 100 continues with step 150 in which the wafer may be flipped over such that the backside of the wafer is facing up in order to process the backside of the wafer.

The method 100 continues with step 160 in which a through wafer etch process is performed on the backside of the wafer in order to perform a backside alignment process. The through wafer etch process may include using an oxide etcher to first break through a hard mask on the backside of the wafer. After breaking through the hard mask, a through wafer bulk etch process may be performed using a deep reactive ion etch (DRIE) silicon etcher. The DRIE etcher may have a high selectivity between the silicon and the oxide film. In the present example, the etching rate may be about 12 μm per minute and the wafer substrate thickness that may be etched is about 650 μm. For a higher oxide selectivity concern, the remaining silicon substrate, thin oxide layer, and conductive layer may be etched away by an over etching step.

The method 100 continues with step 170 in which a backside alignment process may be performed with the optical vernier formed on the front-side of the wafer. The backside alignment process may be performed by a photo stepper having a photo alignment system. The photo alignment system may use a light source and optics to illuminate marks on a reticle (which is used to pattern the backside of the wafer) and align them with the optical vernier on the front-side. Following the backside alignment process, a photolithography process may proceed to pattern the backside of the wafer with the image of the reticle, and then etch through the wafer from the backside to the front-side accordingly. At the same time, the electrical testing structure formed in the conductive layer may be partially etched away resulting in two separate electrical testing structures. The two separate electrical testing structures may then be measured to determine a backside alignment overlay accuracy of the image of the reticle that was transferred from the backside of the wafer to the front-side of the wafer. The measurements may be provided to the photo alignment system so that the system can adjust the position of the wafer for the next photolithography process.

Figure 2:
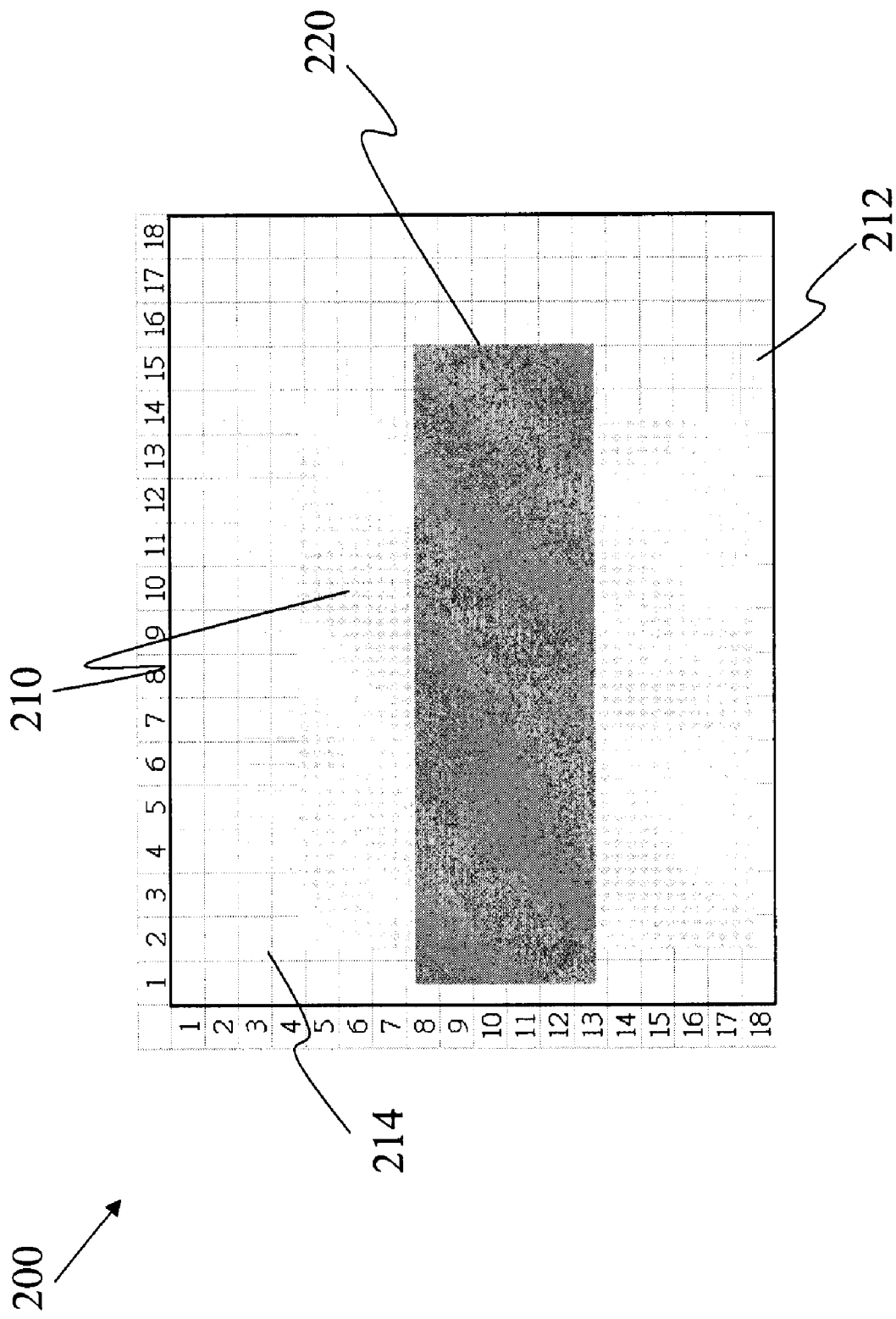
FIG. 2 is a top view of an optical vernier that may be used in the method of FIG. 1.

Referring to FIG. 2, illustrated is a top view of an optical vernier 200 that may be used in the method 100 of FIG. 1. The optical vernier 200 may comprise a first layer pattern 210 having a grid of squares. The grid of squares may be configured to include positional lines in an x-direction 212 and y-direction 214. The optical vernier 200 may be patterned in a conductive layer (step 120 of FIG. 1) by photolithography and etch process. During backside alignment, a second layer pattern 220 may be generated overlying the first layer pattern 210. The second layer pattern 220 may be generated by a reticle and a photo alignment system in which the wafer is flipped over in order to process the backside. The reticle may be used to pattern the backside of the wafer. The positional lines in the x-direction 212 and y-direction 214 may be used for aligning the second layer pattern 220 over the first layer pattern 210 and for providing positional data (e.g., overlay shift data) to the photo alignment system.

Figure 3:
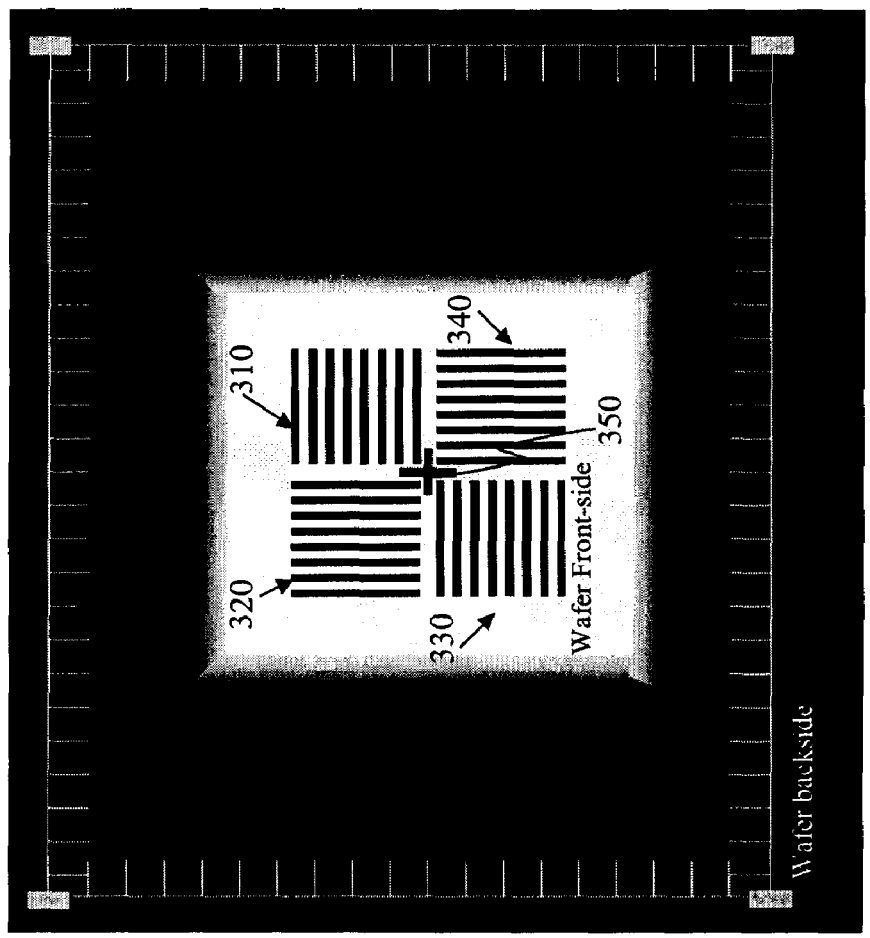
FIG. 3 is a top view of another optical vernier that may be used in the method of FIG. 1

Referring to FIG. 3, illustrated is a top view (from the backside of the wafer to the front-side of the wafer) of another optical vernier 300 that may be used in the method 100 of FIG. 1. The optical vernier 300 may comprise sets of parallel lines 310, 320, 330, 340. The sets of parallel lines 310, 320, 330, 340 may be positioned in a box shape. The optical vernier 300 may also comprise a cross pattern 350 positioned in the center of the set of parallel lines 310, 320, 330, 340. The optical vernier 300 may be patterned in a conductive layer (step 120 of FIG. 1) by photolithography and etch process. During backside alignment, a photo alignment system may use a light source, such as an alignment laser, to align marks on a reticle with the optical vernier 300 on the front-side. The optical vernier 300 may be captured by the alignment laser and positional data are calculated in the final alignment. Following the photo alignment, the reticle may be used to pattern and process the backside of the wafer.

Figure 4:
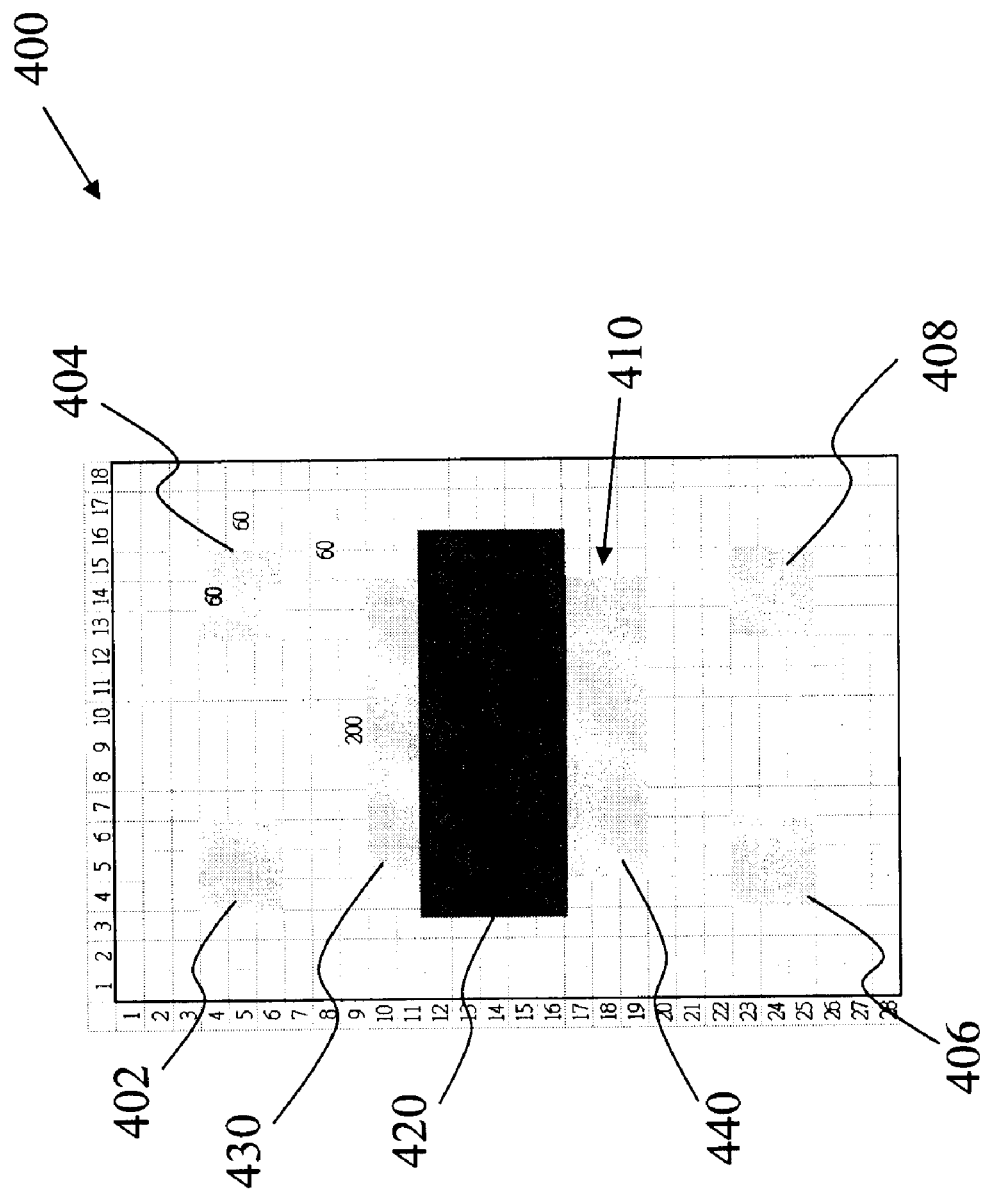
FIG. 4 is a top view of an electrical testing structure that may be used in the method of FIG. 1.

Referring to FIG. 4, illustrated a top view of an electrical testing structure 400 that may be used in the method 100 of FIG. 1. The electrical testing structure 400 may be patterned in the conductive layer (step 120 of FIG. 1) by photolithography and etch process. The electrical testing structure 400 may comprise an upper set of pads 402, 404 and a lower set of pads 406, 408, that are coupled to a central body 410. During subsequent processing of the backside of the wafer, an area 420 of the central body 410 may be etched away resulting in two separate electrical testing structures, an upper electrical testing structure 430 and a lower electrical testing structure 440. The upper set of pads 402, 404 may be used to measure a resistance of the upper electrical testing structure 430 and the lower set of pads 406, 408 may be used to measure a resistance of the lower electrical testing structure 440. These measurements can determine a backside alignment overlay accuracy of an image of the reticle that was used to pattern the backside of the wafer. Additionally, positional data (e.g., overlay shift data) may be provided to the photo alignment system for the next photolithography process.

Figure 5:
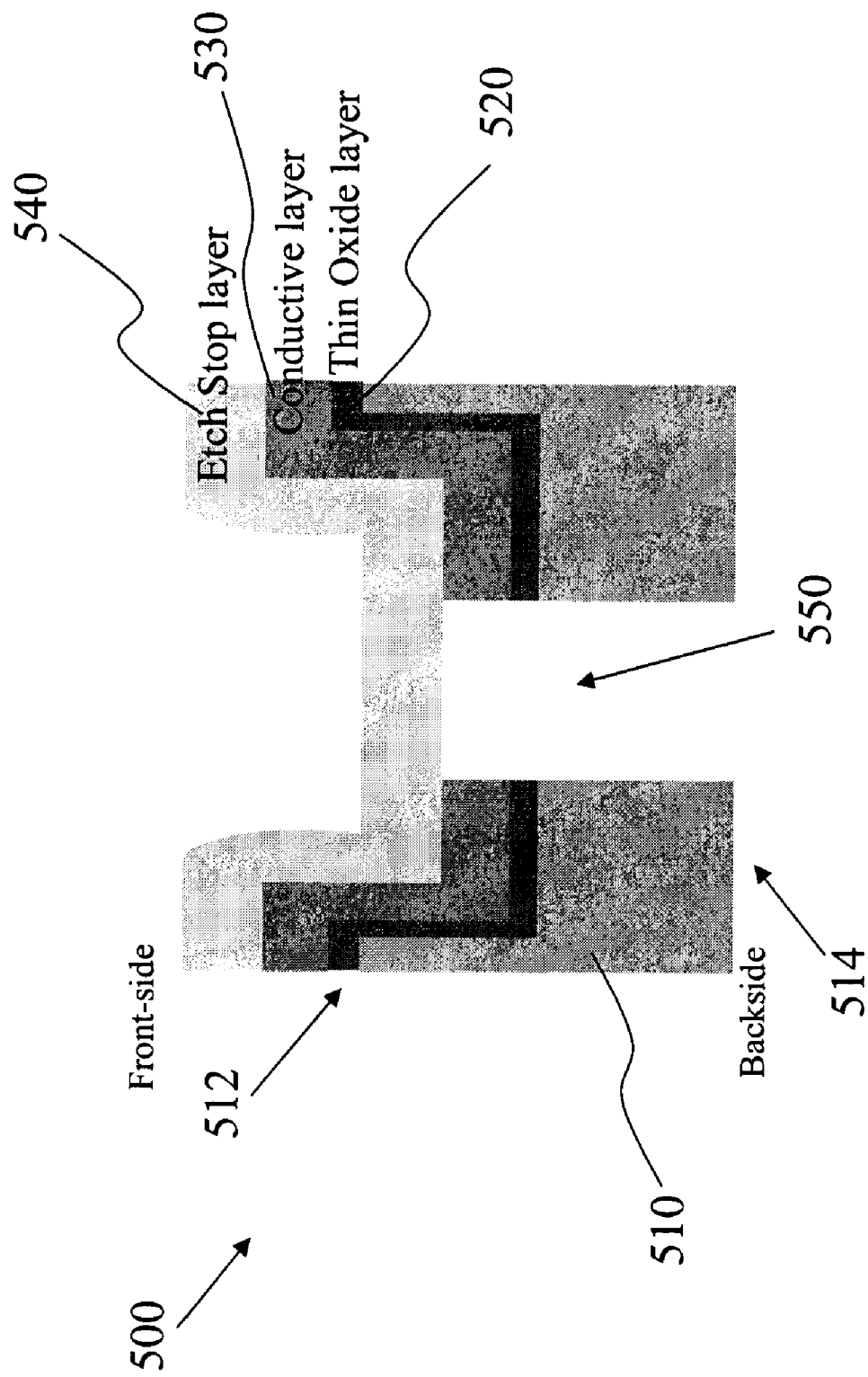
FIG. 5 is a cross-sectional view of an alignment layer formed according to the method of FIG. 1.

Referring to FIG. 5, illustrated is a cross-sectional view of an alignment layer formed on a semiconductor substrate 510 according to the method 100 of FIG. 1. The semiconductor substrate 510 includes a front-side 512 and a backside 514. The thickness of the substrate 510 is preferably around 650 μm. On the front-side 512 of the substrate 510, a thin oxide layer 520 may be deposited over substrate to act as a buried layer. The thin oxide layer 520 may preferably have a thickness of about 125 A. A conductive layer 530 may be deposited over the thin oxide layer 520. The conductive layer 530 may include a doped polysilicon or other suitable conductor material. The conductive layer 530 may preferably have a thickness of about 3000 A. An optical vernier and electrical testing structure may be patterned in the conductive layer. An etch stop layer 540 may be deposited over the patterned conductive layer 530. The etch stop layer 540 may be an oxidation film or a thermal oxide. Additionally, a protective layer (not shown) may optionally be deposited over the etch stop layer 540 to protect the front-side 512 when the substrate 510 is flipped over to process the backside 514.

On the backside 514 of the substrate 510, an etch stop layer (not shown) may be deposited on the backside to form a backside hard mask for through wafer etching. The backside hard mask prevents etching damage to the substrate when through wafer etching is subsequently performed. The thickness of the backside hard mask is preferably around 5,000 A. The backside hard mask may be necessary for a higher photoresist etch rate and to add thickness to the structure. The backside hard mask may be deposited using common oxidation techniques. During subsequent patterning and processing of the backside 514, an etch process 550 may be performed to remove a portion of the substrate 510, thin oxide layer 520, and conductive layer 530 in order to determine a backside alignment overlay accuracy as was described in FIG. 1.

Figure 6:
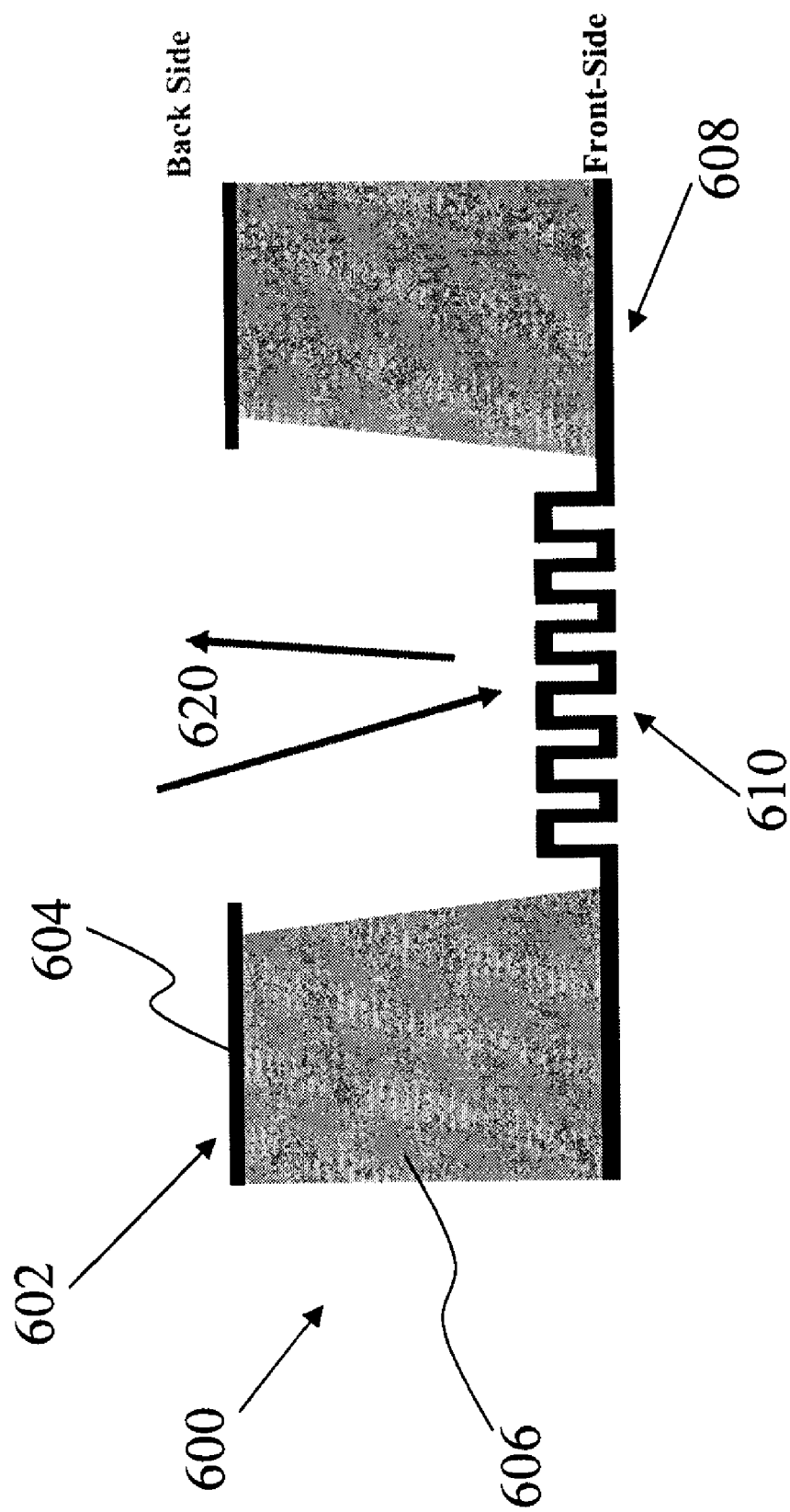
FIG. 6 is a cross-sectional view of a through wafer etch process according to the method of FIG. 1.

Referring to FIG. 6, illustrated is a cross-sectional view of a through wafer etch process according to the method 100 of FIG. 1. After the front-side deposition process is complete (steps 110 through 140 of FIG. 1), the wafer 600 may be flipped over so that the backside 602 is facing up. The backside process then begins with a through wafer etch process. An oxide etcher may be used to break through the backside hard mask 604. A through wafer bulk etch process may then be performed to etch through the wafer substrate 606 from the backside 602 to the front-side 608 to expose an alignment mark 610, such as an optical vernier, for a subsequent backside photo alignment process. In one embodiment, the through wafer bulk etch may be performed using a deep reactive ion etch (DRIE) silicon etcher. The DRIE silicon etcher may have a high etching selectivity between the silicon and oxide layer. For example, the etching rate may be about 12 μm per minute and 650 μm of the substrate 606 may be etched away. For higher oxide selectivity concern, the remaining substrate, buried oxide layer, and conductive layer may etched away by an over etching step. Once the through wafer etch process is completed, a photo alignment process 620 may be performed with the alignment mark 610 on the front-side in order to pattern (e.g., first layer photolithography process) the backside 602 for further processing.

Figure 7:
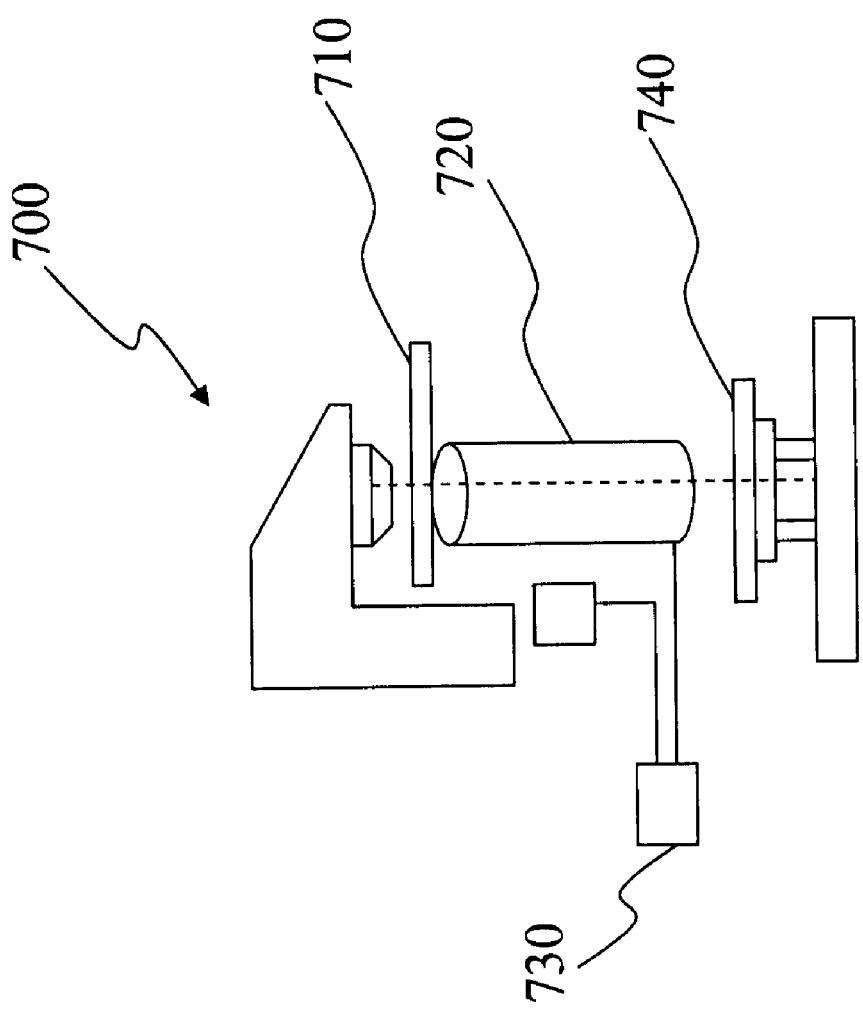
FIG. 7 is a schematic diagram of a photo alignment system that may be used in the method of FIG. 1.

Referring to FIG. 7, illustrated is a diagram of a photo alignment system 700. Aspects of the present disclosure may be implemented within the photo alignment system 700. The photo alignment system 700 may comprise a reticle 710, a projection lens 720, an alignment laser source 730, and a wafer stage 740. Once the front-side and backside processes are performed according to steps described above in FIG. 1, the reticle 710 may be aligned (from the backside of the wafer) with the optical vernier formed on the front-side of the wafer using the photo alignment system 700.

In summary, aspects of the present disclosure provides a method for wafer backside alignment. The method includes forming a buried layer on a front-side of a wafer; forming a conductive layer on the buried layer and patterning a first test structure and a second test structure therein; forming an etch stop layer on the conductive layer; etching through the wafer from the backside to perform an alignment process with the first test structure; and determining an overlay accuracy of the alignment process with the second test structure. In some embodiments, the step of forming the conductive layer includes configuring the first test structure to include an optical vernier and the second test structure to include an electrical testing structure. In other embodiments, the step of etching through the wafer to perform the alignment process includes performing a photo alignment process from the backside of the wafer with the optical vernier.

Also provided is a wafer for backside alignment including a substrate having a front-side and a backside; a hard mask formed on backside of the substrate; and an alignment layer formed on the front-side of the substrate. The alignment layer comprises a thin oxide layer formed on the front-side of the substrate, a conductive layer formed on the thin oxide layer, a thick oxide layer formed on the conductive layer, and a first test structure and a second test structure patterned in the conductive layer, wherein the first test structure is used for a backside alignment process and the second structure is used to determine an overlay accuracy of the backside alignment process. In some embodiments, the thin oxide layer has a thickness of about 125 A. In some other embodiments, the conductive layer includes a doped polysilicon having a thickness of about 3000 A. In still other embodiments, the alignment layer further includes a protective layer formed on the thick oxide layer having a thickness of about 30,000 A.

In other embodiments, the first test structure includes an optical vernier comprising positional lines in an x-direction and y-direction. In some other embodiments, the second test structure includes an electrical testing structure comprising an upper set of pads, a lower set of pads, and a central body coupled to the upper set of pads and the lower set of pads. The central body is separated into an upper portion and a lower portion during a subsequent etching of the conductive layer from the backside to the front-side of the substrate, wherein the upper portion is coupled to the upper set of pads and the lower portion is coupled to the lower set of pads.

Also provided is a method for determining an overlay accuracy of a backside alignment process. The method includes the steps of: forming a thin oxide layer on a front-side of a semiconductor wafer; forming a conductive layer on the thin oxide layer; patterning an alignment mark and a test structure in the conductive layer; forming a thick oxide layer on the patterned conductive layer; flipping the semiconductor wafer over so that a backside of the wafer is facing up; etching through the semiconductor wafer from the backside to the front-side to perform a backside alignment process with the alignment mark; patterning and etching through the conductive layer after performing the backside alignment process; and measuring the test structure to determine the overlay accuracy of the backside alignment process. In some embodiments, the step of etching through the semiconductor wafer is by a deep reactive ion etch (DRIE) process. In some other embodiments, the step of patterning an alignment mark includes configuring the alignment mark to include an optical vernier. In still other embodiments, the step of patterning and etching through the conductive layer includes partially etching away the test structure to form an upper test structure and a lower test structure. In other embodiments, the step of measuring the test structure includes measuring a resistance of the upper test structure and a resistance of the lower test structure.

It is to be understood that the following disclosure provides different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed.

Several different advantages exist with these and other embodiments. In addition to providing an efficient and cost-effective method and system for wafer backside alignment, the method and system disclosed herein can easily be integrated with current semiconductor processing techniques and equipment. The method and system does not require additional procedures and/or specialized equipment. For example, no additional lithographic steps are required and the original stepping process may be used. Additionally, the method and system provides real-time overlay accuracy measurements and feed back for advance process control and wider process window for fabrication of MEMS devices and other three-dimensional devices.

What is claimed is:

1. A method comprising:
   forming a buried layer on a front-side of a wafer;
   forming a conductive layer on the buried layer and patterning a first test structure and a second test structure therein;
   forming an etch stop layer on the conductive layer;
   etching through the wafer from the backside to perform an alignment process with the first test structure; and
   determining an overlay accuracy of the alignment process with the second test structure.

2. The method of claim 1, wherein the step of forming the conductive layer includes configuring the first test structure to include an optical vernier and the second test structure to include an electrical testing structure.

3. The method of claim 2, wherein the step of etching through the wafer to perform the alignment process includes performing a photo alignment process from the backside of the wafer with the optical vernier on the front-side of the wafer.

4. The method of claim 2, further comprising the steps of:
   patterning the backside of the wafer by photolithography after performing the alignment process; and
   etching the patterned backside of the wafer.

5. The method of claim 4, wherein the step of etching the patterned backside of the wafer includes partially etching the electrical testing structure to form an upper electrical testing structure and a lower electrical testing structure.

6. The method of claim 5, wherein the step of determining the overlay accuracy of the alignment process includes measuring a resistance of the upper electrical testing structure and the lower electrical testing structure.

7. The method of claim 1, wherein the step of forming the buried layer includes configuring the buried layer to include a thin oxide layer having a thickness of about 125 A.

8. The method of claim 1, wherein the step of forming the conductive layer includes configuring the conductive layer to include a doped polysilicon having a thickness of about 3000 A.

9. The method of claim 1, further comprising the step of forming a protective layer on the etch stop layer to protect the front-side of the wafer when processing the backside of the wafer, wherein the protective layer has a thickness of about 30,000 A.

10. A method for determining an overlay accuracy of a backside alignment process, the method comprising:
    forming a thin oxide layer on a front-side of a semiconductor wafer;
    forming a conductive layer on the thin oxide layer;
    patterning an alignment mark and a test structure in the conductive layer;
    forming a thick oxide layer on the patterned conductive layer;
    flipping the semiconductor wafer over so that a backside of the wafer is facing up;
    etching through the semiconductor wafer from the backside to the front-side to perform a backside alignment process with the alignment mark;
    patterning and etching through the conductive layer after performing the backside alignment process; and
    measuring the test structure to determine the overlay accuracy of the backside alignment process.

11. The method of claim 10, wherein the step of etching through the semiconductor wafer is by a deep reactive ion etch (DRIE) process.

12. The method of claim 10, wherein the step of patterning an alignment mark includes configuring the alignment mark to include an optical vernier.

13. The method of claim 10, wherein the step of patterning and etching through the conductive layer includes partially etching away the test structure to form an upper test structure and a lower test structure.

14. The method of claim 13, wherein the step of measuring the test structure includes measuring a resistance of the upper test structure and a resistance of the lower test structure.

* * * * *